(12) United States Patent
Lubashevsky et al.

(10) Patent No.: US 10,824,079 B2
(45) Date of Patent: Nov. 3, 2020

(54) DIFFRACTION BASED OVERLAY SCATTEROMETRY

(71) Applicant: KLA-TENCOR CORPORATION, Milpitas, CA (US)

(72) Inventors: Yuval Lubashevsky, Haifa (IL); Yuri Paskover, Binyamina (IL); Vladimir Levinski, Migdal HaEmek (IL); Amnon Manassen, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/122,495

(22) Filed: Sep. 5, 2018

(65) Prior Publication Data

US 2019/0004439 A1    Jan. 3, 2019

Related U.S. Application Data

(63) Continuation-in-part of application No. 15/757,119, filed as application No. PCT/US2018/012070 on Jan. 2, 2018.

(60) Provisional application No. 62/441,703, filed on Jan. 3, 2017.

(51) Int. Cl.
*G03F 7/20* (2006.01)
*G01N 21/95* (2006.01)
*G02B 27/42* (2006.01)
*G01N 21/47* (2006.01)

(52) U.S. Cl.
CPC ..... *G03F 7/70633* (2013.01); *G01N 21/4788* (2013.01); *G01N 21/9501* (2013.01); *G02B 27/4255* (2013.01); *G03F 7/70625* (2013.01)

(58) Field of Classification Search
USPC .......................................................... 382/141
See application file for complete search history.

(56) References Cited

U.S. PATENT DOCUMENTS

| | | | |
|---|---|---|---|
| 5,453,969 A * | 9/1995 | Psaltis | G11B 7/005 369/110.01 |
| 2005/0012928 A1 | 1/2005 | Sezginer et al. | |
| 2012/0206703 A1 | 8/2012 | Bhattacharyya et al. | |
| 2012/0244461 A1 | 9/2012 | Nagai | |

(Continued)

FOREIGN PATENT DOCUMENTS

FR    2732763 A1 * 10/1996    ........... G01B 11/306

OTHER PUBLICATIONS

ISA/KR, International Search Report for PCT/US2018/012070 dated Apr. 24, 2018.

(Continued)

*Primary Examiner* — Amandeep Saini
(74) *Attorney, Agent, or Firm* — Hodgson Russ LLP

(57) ABSTRACT

A method of monitoring overlay is used in a manufacturing process in which successive layers are deposited one over another to form a stack. Each layer may include a periodic structure such as a diffraction grating to be aligned with a periodic structure in another layer. The stacked periodic structures may be illuminated to form + and − first order diffraction patterns from the periodic structures. An image of the stacked periodic structures may be captured including + and − diffraction patterns. The + and − diffraction patterns may be compared to calculate the overlay between successive layers.

16 Claims, 5 Drawing Sheets

(56) References Cited

U.S. PATENT DOCUMENTS

2016/0146740 A1* 5/2016 Lu .................. G01B 11/272
　　　　　　　　　　　　　　　　　　　　356/620
2016/0216197 A1* 7/2016 Bringoltz ............ G03F 7/70683

OTHER PUBLICATIONS

ISA/KR, International Search Report for PCT/US2018/057896 dated Feb. 21, 2019.

* cited by examiner

US 10,824,079 B2

DIFFRACTION BASED OVERLAY SCATTEROMETRY

CROSS REFERENCE TO RELATED APPLICATIONS

This application is a continuation-in-part of U.S. application Ser. No. 15/757,119 filed Mar. 2, 2018, which is a national phase application of PCT/US18/12070 filed Jan. 2, 2018, and which claims priority to the provisional patent application filed Jan. 3, 2017 and assigned U.S. App. No. 62/441,703.

BACKGROUND OF THE INVENTION

Technical Field

The present invention relates generally to the field of scatterometry-based overlay metrology, and more particularly to the use of angularly resolved scatterometry for monitoring errors in overlay between stacked periodic structures, for instance metrology targets such as diffraction gratings printed on respective layers in a semiconductor wafer.

In a layered manufacturing process such as the manufacture of semiconductor wafers, it is necessary for printed patterns in respective layers to be properly aligned when laid down in order for the manufacturing process and the eventual manufactured products to function correctly. As is well known in the art the alignment may be assisted through the use of a dedicated metrology target, such as a diffraction grating printed on at least some of the layers. The term "overlay" is used herein unless otherwise stated to refer to a measurement of the alignment of patterns in successive layers of a wafer. The greater the overlay, the greater is the misalignment. An overlay measurement other than zero is also referred to in the art as an "overlay error".

Discussion of Related Art

A metrology target may take the form of a set of cells, for example a 2×2 array of rectangular or square cells, each comprising a diffraction grating, two for measuring overlay in the X direction and two for measuring overlay in the Y direction. Diffraction patterns obtained by illuminating the cells may be analysed to measure overlay. Currently, methods of obtaining an overlay value involve measuring multiple cells. For example, in some known overlay measurement methods, measuring the intensity difference between the + and − (also referred to herein as "±") first diffraction orders leads to a determination of an overlay value.

SUMMARY OF THE INVENTION

The following is a simplified summary providing an initial understanding of the invention. The summary does not necessarily identify key elements nor limits the scope of the invention, but merely serves as an introduction to the following description.

Some embodiments of the invention provide systems and methods for monitoring overlay errors between stacked periodic structures. A method according to an embodiment of the invention may comprise capturing an image of the stacked periodic structures including+ and − order diffraction patterns, and comparing the ± diffraction patterns to identify an overlay error between successive layers. Thus instead of for example simply considering the relative intensities of the diffraction orders, the patterns themselves may be compared, for example by analysis in an analysing unit. The diffraction patterns may be the first order diffraction patterns.

The diffraction patterns may comprise interference fringes, and the comparison of the diffraction patterns may comprise comparing the fringe positions to identify any asymmetry between the + and − diffraction patterns.

A method according to some embodiments of the invention may be performed in an existing metrology system, for example in an image analysis unit which may form part of such a system. Therefore an embodiment of the invention may comprise a computer readable medium, either transitory or non-transitory, comprising instructions which when implemented in a processor of a computing system such as an image analysis unit cause the system to analyze images according to any of the methods described herein.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
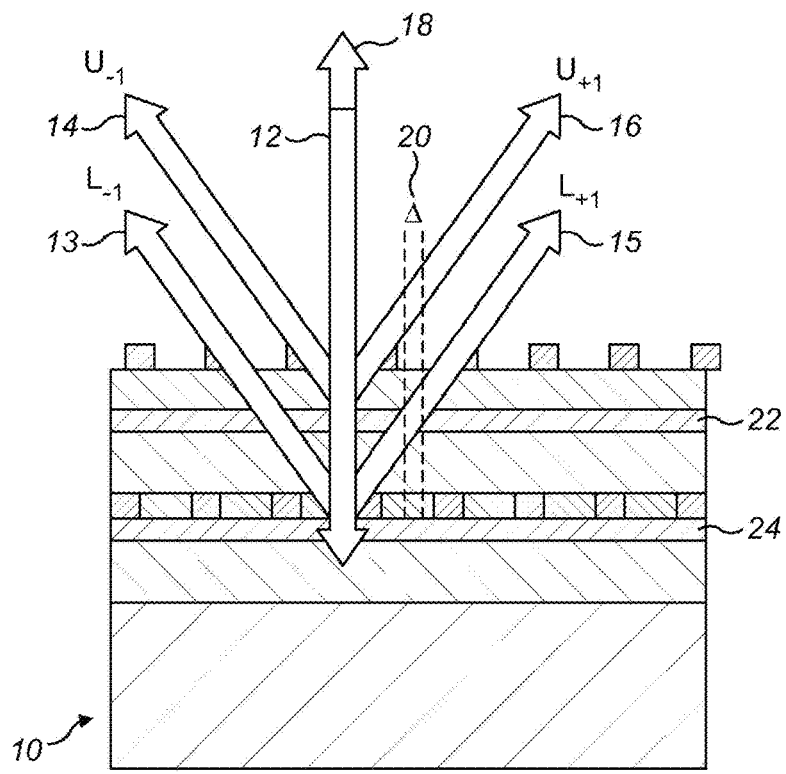
FIG. 1 is a schematic cross-sectional view of a typical cell in an overlay target according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

FIG. 1 is a schematic representation of scatterometry-overlay ("SCOL") measurement. The figure depicts a stacked structure 10 in cross section comprising a stack of successive layers, two of which include diffraction gratings 22 and 24. These may for example be part of a single cell in a metrology target. The illumination ray 12 may be pointed towards the stack and may then be directly reflected and also diffracted in directions represented by vectors 13-16. The "U" and "L" rays may represent diffractions from upper grating 22 and lower grating 24 respectively. As illustrated in FIG. 1, the two diffraction gratings have the same period but different thicknesses. The gratings are shown to be misaligned and the overlay or degree of misalignment is indicated by reference numeral 20.

Figure 2:
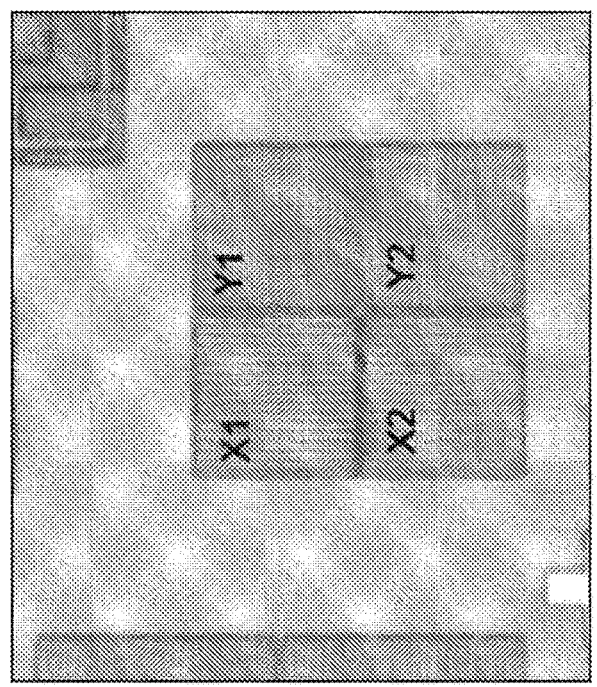
FIG. 2 is a plan view of a typical cell in an overlay target according to some embodiments of the invention.

FIG. 2 is a plan view of a stacked periodic structure. In this particular example, the structure comprises four rectangular cells labelled X1, X2, Y1, Y2, each comprising a diffraction grating, for example a grating as shown schematically in FIG. 1.

The received signals at the pixels of an image capturing device in a first order scatterometry configuration may be a result of interference between first diffraction orders of the upper and bottom gratings within a stacked periodic structure that have the same pitch (groove spacing of the printed pattern). The diffracted EM field E from either grating may be given as:

$$E_{U/L}^{(\pm 1)} = A_{U/L}^{(\pm 1)} e^{i\left[\pm \frac{2\pi}{P}(OVL) + \Psi_{U/L}\right]} \quad \text{EQ. 1}$$

$A_U$ and $A_L$ represent amplitudes of the diffraction orders of individual gratings and phases $\Psi_U$ and $\Psi_L$ correspond to the topographic phases stemming from stack parameters (e.g. thicknesses of stack layers, optical constants, reflection and transmission at every interface within stack) common to the positive and negative diffraction orders. P represents the pitch, or period of the grating pattern. The intensity I of each of the diffraction orders may depend on both the diffraction efficiencies of the gratings and the topographic phase difference $-(\Psi_U - \Psi_L)$. $f_0$ represents an intentional offset used in SCOL overlay targets.

$$E_{SCOL}^{(\pm 1)} = E_U^{(\pm 1)} + E_L^{(\pm 1)} = A_{SCOL}^{(\pm 1)} E^{i\Psi_{SCOL}} \quad \text{EQ. 2}$$

$$I^{\pm 1}(\pm f_0) = |E_{SCOL}^{(\pm 1)}|^2 = |E_U^{(\pm 1)} + E_L^{(\pm 1)}|^2 = \quad \text{EQ. 3}$$
$$A_U^2 + A_L^2 + 2A_U A_L \cos\left[\Psi_U - \Psi_L \pm \frac{2\pi}{P}(OVL)\right] = |A_{SCOL}^{(\pm 1)}|^2$$

The overlay value may be extracted from EQ. 3.

Figure 3:
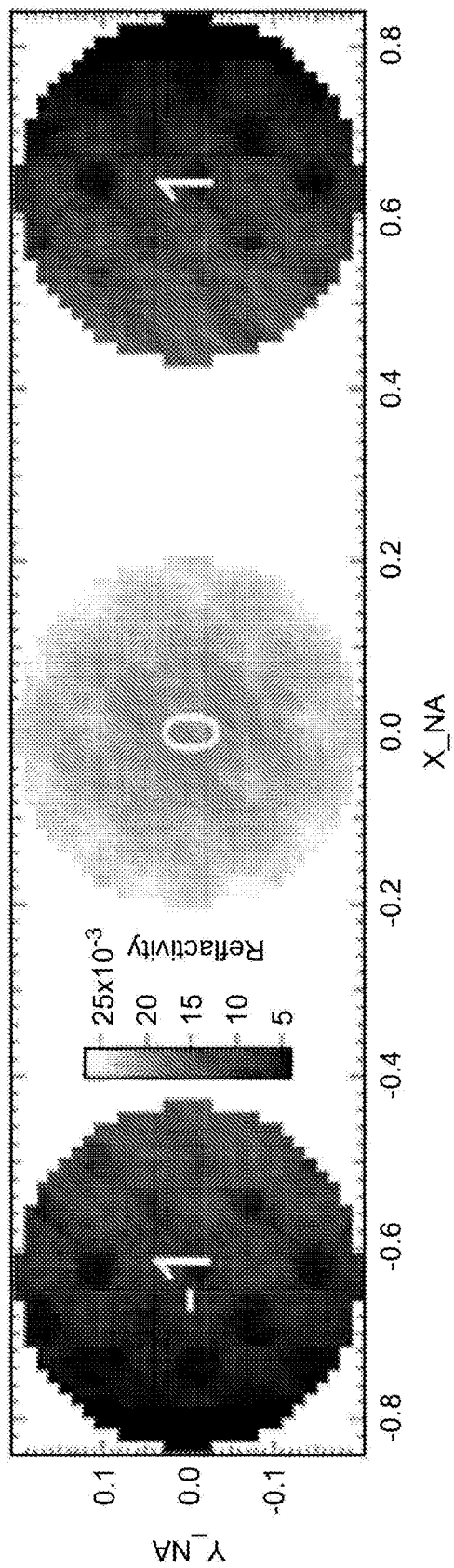
FIG. 3 depicts a captured image of zero and ± first diffraction orders in a thin stack of layers according to some embodiments of the invention.

FIG. 3 depicts a captured image of zero, first and second diffraction orders in a thin stack, e.g. a stack of thin layers. The image is typically formed at the pupil plane of an image capturing device in a system such as described further herein with reference to FIG. 6, using a pupil lens, not shown, also referred to as a "collection pupil", or "pupil". The x axis represents positions P along an axis perpendicular to the direction of the lines of the diffraction gratings. The intensity difference between two random angles of illumination (e.g. pupil pixels) is mostly due to different topographic phase– $(\Psi_U - \Psi_L)$. Therefore, the optical path difference between angles of illumination will cause different intensity in the collection pupil. Where the optical path between the upper and lower gratings is short, relative to the measurement's wavelength, the variations of the topographic phase over the pupil plane is small and therefore the intensity may vary "slowly" and monotonically.

Figure 4:
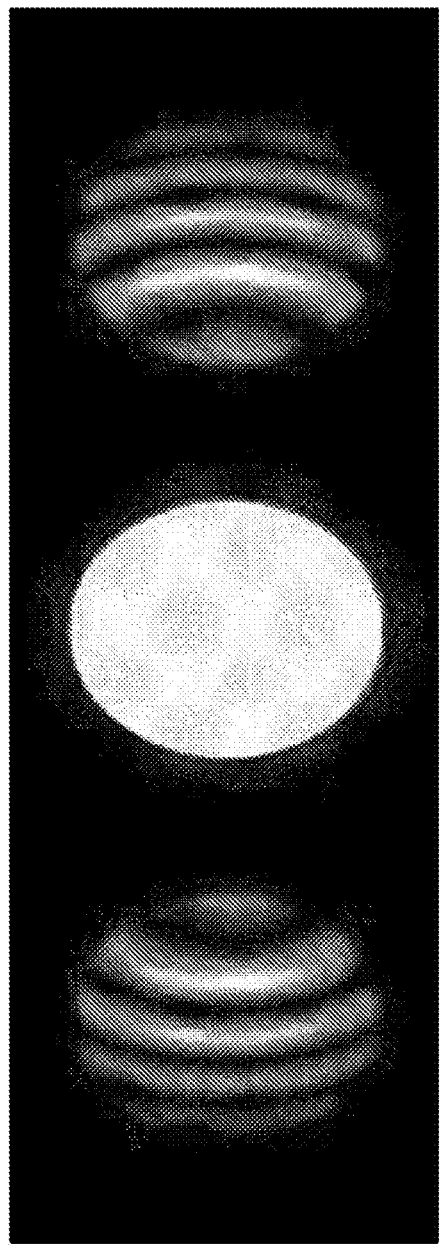
FIG. 4 depicts zero a captured image of zero and ± first diffraction orders in a thicker stack of layers according to some embodiments of the invention.

FIG. 4 depicts a captured image of zero, first and second diffraction orders in a thick stack, e.g. a stack including thicker layers than those of FIG. 3. There is a larger variation of topographic phases over the collection pupil and hence the intensity may vary "faster" and an interference fringe pattern may be revealed. The fringe pattern in the ± first diffraction order, as shown in FIG. 4, may hold important information regarding asymmetries in a stacked periodic structure. Overlay may be one of these asymmetries. Thus, according to some embodiments of the invention, the positive and negative or + and − diffraction patterns may be compared to identify an overlay between successive layers. Embodiments of the invention are not limited to stacks of particular thickness and may be used even for stacks of the kind shown in FIG. 3 as described further herein.

In a hypothetical case where there is a perfect symmetric stacked periodic structure without any overlay, it may be expected that there will be mirror symmetry of the fringe pattern between the ± diffraction orders relative to the pupil center.

If an overlay is present between the upper and lower gratings, the phase of each illumination angle may be slightly altered. The interference fringes which may be generated, when rendered relative to the collection pupil, may no longer possess mirror symmetry. Therefore some embodiments of the invention may comprise comparing the + and − diffraction patterns to calculate the overlay between successive layers, for example by comparing interference fringe positions to identify any asymmetry between the ± diffraction patterns.

In some instances, for example where there is an overlay error or other cause of asymmetry, the fringes in one or both of the + and − diffraction patterns may be translated in the collection pupil thereby breaking the symmetry. The distance moved relative to the interference fringe length may be proportional to the overlay relative to the pitch of the grating. The distance may be determined relative to the axis of symmetry in the hypothetical pattern that would be present absent any cause of asymmetry, for example zero on the x axis shown in FIG. 3. Thus, the overlay error between successive layers may be may be calculated by analyzing and comparing the interference fringe positions relative to the pupil, or center axis, for example analyzing image intensity as a function of position in the image.

In some embodiments of the invention, the comparison of the ± diffraction patterns may comprise determining a characteristic frequency of the + and − diffraction patterns, or fringes, for example in a manner described further herein. In some embodiments of the invention this characteristic frequency may not be a sharp frequency but rather a 'wider' frequency, or frequency band, since the density of the interference fringes may change over the pupil.

In some embodiments of the invention, this frequency may be extracted by manipulating, e.g. via mathematical analysis, the intensity as a function of pupil position, for example analyzing the frequency as a function of pixel position in the pupil plane.

Figure 5:
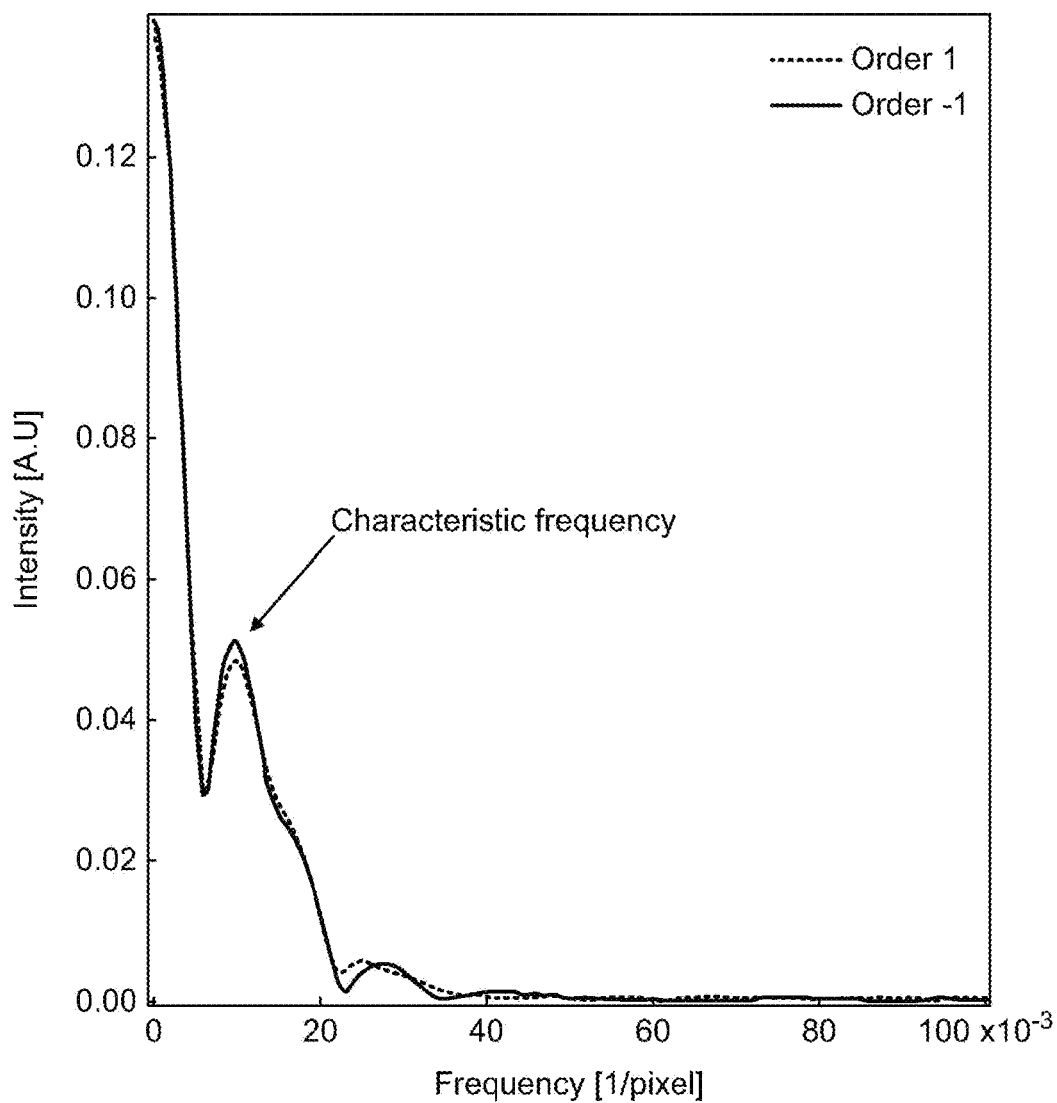
FIG. 5 is a graph depicting the results of fast Fourier transformation "FFT" on images of both±first diffraction orders.

In some embodiments of the invention, the manipulation the intensity as a function of pupil position may be carried out via FFT. FIG. 5 depicts the FFT result (magnitude) of a SCOL measurement according to some embodiments of the invention. In this example, the characteristic frequency is a peak in intensity and is different for the + and − first order diffraction patterns indicating an overlay.

In a simple model approximation, where the fringe density is constant, the Fourier transform term of EQ. 2 may be given in EQ. 4, where $\omega_0$ represents the frequency of the fringes, $\varphi_0$ is the phase between diffraction orders from top and bottom gratings, $\delta(\omega-\omega_0)$ is Dirac's delta function with $\omega$ being the frequency, and $\mathcal{A}$ represents the amplitude of the fringes. $\varphi_0$ may be the same for ±1 diffraction orders. Dirac's delta function examines frequency equal to 1/P, which corresponds to $\omega_0$.

$$\mathcal{F}(I^{\pm 1}) = \sqrt{\frac{\pi}{2}} \cdot \mathcal{A} \cdot e^{\mp i \frac{2\pi}{P} OVL + i\varphi_0} \cdot \delta(\omega - \omega_0) \quad \text{EQ. 4}$$

For measuring the fringes displacement between +1 diffraction order ("DO") and −1 DO, a robust self-correlation algorithm for imaging overlay ("OVL") approach, can be used. Namely, at the first step the center of symmetry of zero order pupil image can be found using self-correlation between zero order image with its flipped image. At the second step the position of maximum self-correlation between, for example, image of −1 DO and flipped image of +1 DO can be found. Regions of interest ("ROIs") should be chosen within the areas where ±1 diffraction orders have non-zeros signals, as shown in FIG. 4. Note that the ROIs should be defined symmetrically with respect to zero order center of symmetry position. The flipping of +1 DO image can also be performed with respect to zero order center position found in the previous step.

The calculated distance ("D") between the original positions of the flipped +1 DO and the position of maximum self-correlation with −1 DO defines the fringes shift relative to each other due to OVL. Next, this distance should be transformed into phase difference by using fringes period (T=1/$\omega_0$) defined in EQ. 4 by using Fourier transform. Accordingly, the OVL value can be calculated as specified in EQ. 5.

$$OVL = \frac{PD}{4\pi T} \quad \text{EQ. 5}$$

In some embodiments of the invention, the overlay value in EQ. 5 may be detected by analyzing a single grab, or image capture, of a single cell. In such embodiments, no extra cells/grabs are needed for this metrology operation thereby saving on time and processing power.

Another approach for determining OVL can be obtained from EQ. 4. Accordingly, the OVL value can be found using EQ. 6. $S^{+1}$ and $S^{-1}$ are signals corresponding to ±1 diffraction orders.

$$OVL = \frac{P}{4\pi} \mathcal{I}m\left(\frac{\mathcal{F}(S^{+1})}{\mathcal{F}(S^{-1})_{\omega = f_0}}\right) \quad \text{EQ. 6}$$

However, aspects of a layered manufacturing process other than overlay, such as sidewall angle and top tilt, also may be capable of destroying the symmetry of interference fringes. However, whilst the phase contributions of such aspects may have the same effect as overlay errors, in that the interference fringes move relative to the pupil, the amplitude contributions may not cause any movement of the interference fringes but rather only alter their intensity. In such situations, there may be no amplification of the interference fringe asymmetry from amplitude contributions and thus the effect on the detection of overlay error is minor. Therefore systems and methods according to some embodiments of the invention may have an advantage in providing a measurement of overlay that is less affected by other causes of fringe asymmetry.

In some embodiments of the invention, the amplitude contribution may be isolated. For example an asymmetry factor may be determined for asymmetry in the + and − diffraction patterns not caused by overlay. One possible equation for determining an asymmetry factor is shown below by way of example in EQ. 7:

$$AsymFactor = \left|\frac{\mathcal{F}(S^{+1})}{\mathcal{F}(S^{-1})_{\omega = f_0}}\right| = \left|\frac{\mathcal{A}(S^{+1})}{\mathcal{A}(S^{-1})_{\omega = f_0}}\right| \quad \text{EQ. 7}$$

In the case of a symmetric target, the value of the asymmetry factor will be 1 (irrelevant of overlay). Any other value will indicate the direction and magnitude of the asymmetry. Moreover, the asymmetry factor may be used to correct the overlay value from EQ. 5 and remove the asymmetry magnification, in other words the asymmetry factor may be applied to the overlay calculation, for example resulting in EQ. 8:

$$OVL = \frac{\frac{P}{4\pi} \mathcal{I}m\left(\frac{\mathcal{F}(S^{+1})}{\mathcal{F}(S^{-1})_{\omega = f_0}}\right)}{AsymFactor} \quad \text{EQ. 8}$$

Whereas i can be the square root of negative one in these equations, $\mathcal{I}m$ can represent the imaginary part of a complex expression or number.

The FFT procedure may be most effective when at least two fringes are available in the collection pupil. For a typical semiconductor manufacturing process, this requires a stack of at least 4 µm high. Therefore, in typical current processes the use of FFT would be most effective for thin stacks of layers as described above.

In some embodiments of the invention, the FFT procedure may be replaced by other techniques such as but not limited to fitting procedures or derivative procedures. Such alternative procedures may be suitable for a wide range of stack thickness but may be more suitable than FFT for thinner stacks.

Some embodiments of the invention may lead to significant improvement over known processes for overlay measurement. Some known processes require analysis of signals from multiple cells, for example deriving an overlay value from EQ. 2, which can result in cumulative errors being included. Some such processes suffer from strong dependency on process variations which increase the metrology inaccuracy. By contrast, in some embodiments of the invention, signal analysis may be improved by single cell-single grab scatterometry measurement which may overcome a large portion of such inaccuracies.

In some embodiments of the invention, all available pupil pixels are viewed as collective data to analyze the pupil function behavior, which may act to improve the signal to noise ratio of the method. This is in contrast to analysis of intensity differences between pairs of pixels in corresponding diffraction patterns.

Algorithmic inaccuracy can occur when higher scattering orders interfere with the simple first order scatterometry. Signal contamination by different orders with different information about the overlay may occur without the ability to filter each order's signal. Embodiments of the invention which use only the first order diffraction patterns may overcome these disadvantages.

Any asymmetries in the diffraction grating may contribute to both the phases and the amplitudes difference between ± first diffraction orders. While analyzing the pupil intensity, the amplitudes differences are amplified and can substantially affect the resultant overlay. According to some embodiments of the invention the effects of such asymmetries may be mitigated.

Figure 6:
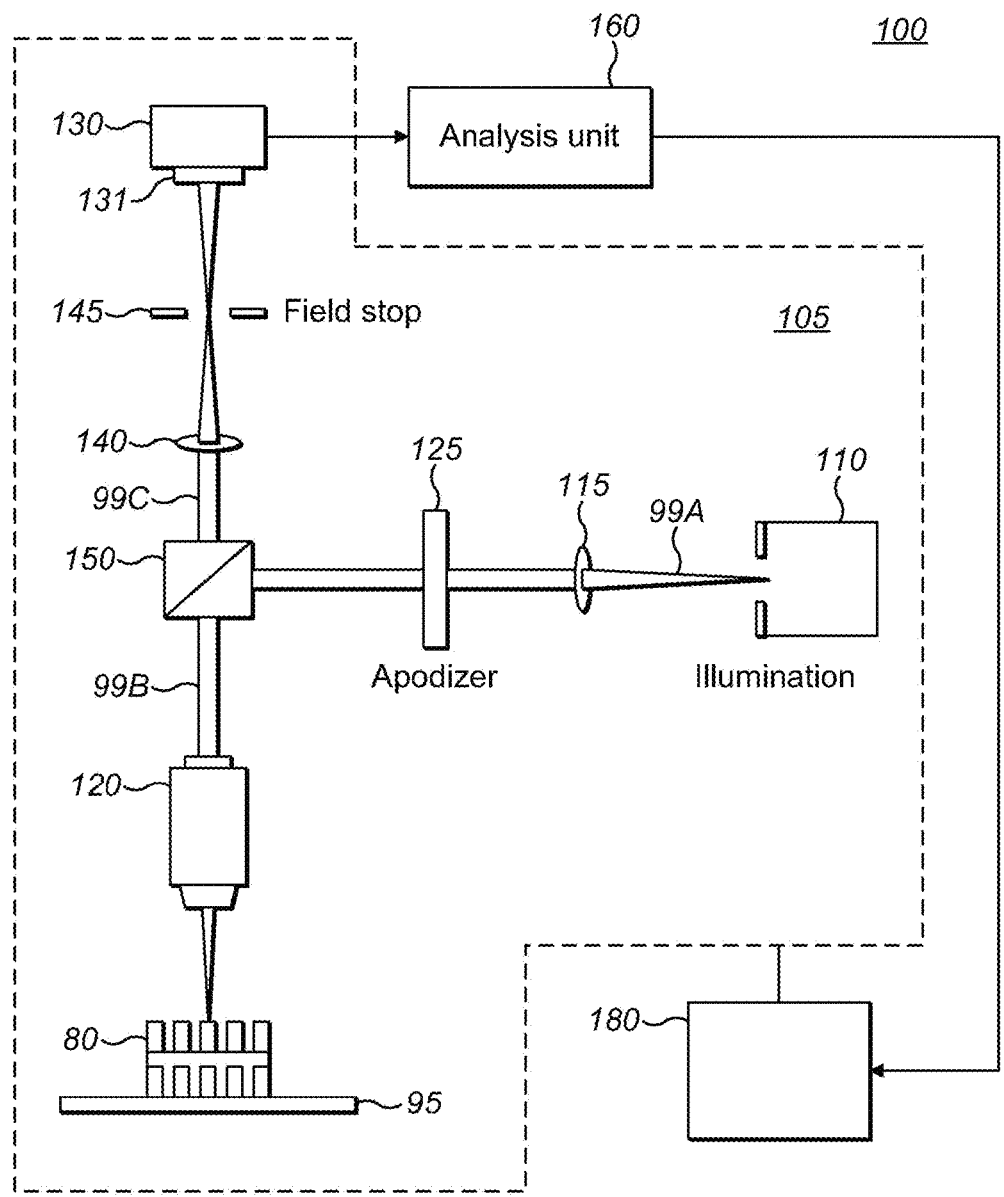
FIG. 6 is a schematic diagram of a system according to some embodiments of the invention.

FIG. 6 is a schematic diagram of a system 100 according to some embodiments of the invention. System 100 comprises an imaging system 105, analysis unit 160 and controller 180. Imaging system 105 comprises an illumination source 110. This may be any suitable illumination source known to those skilled in the art. The image analysis unit 160 may comprise one or more processors, as is known in the art. The processors may implement instructions, for example in the form of a computer algorithm, that cause the system or the analysis unit to implement a method according to some embodiments of the invention.

In the imaging system 105 of FIG. 6, radiation 99A from illumination source 110 passes through collimator 115 via apodizer 125 to beam splitter 150, where radiation 99B is directed via target objective 120 to a target on wafer 80 supported on stage 95. The target includes a diffraction grating, and diffracted radiation is returned from the target on wafer 80, via the objective 120 to the beam splitter 150. System 100 further comprises a pupil camera 130 such as a charge coupled device or "CCD" array arranged to receive diffracted radiation 99C and an analysis unit 160 arranged to analyze images generated by the pupil camera 130. Thus, image capturing operations according to some embodiments of the invention may be performed by an image capturing device such as pupil camera 130. Diffracted radiation 99C is directed by the beam splitter 150 to camera 130 via focus lens 140 and field stop 145. Pupil camera 130 is arranged to form an image from the diffracted radiation 99C at pupil plane 131, as is known in the art.

The illumination may comprise but is not limited to illumination with particle beams such as in ebeam systems or exposure to radiation such as x-rays and any other form of electromagnetic radiation.

Controller 180 is configured to control the operation of imaging system 105 including stage 95. Stage 95 may be movable. For example controller 180 may control imaging system 105, and/or the position of the stage 95 supporting the wafer 80, to scan a target on wafer to capture pupil images at different locations on the target. The operation of controller 180 may be based in part on signals from the analysis unit 160.

Figure 7:
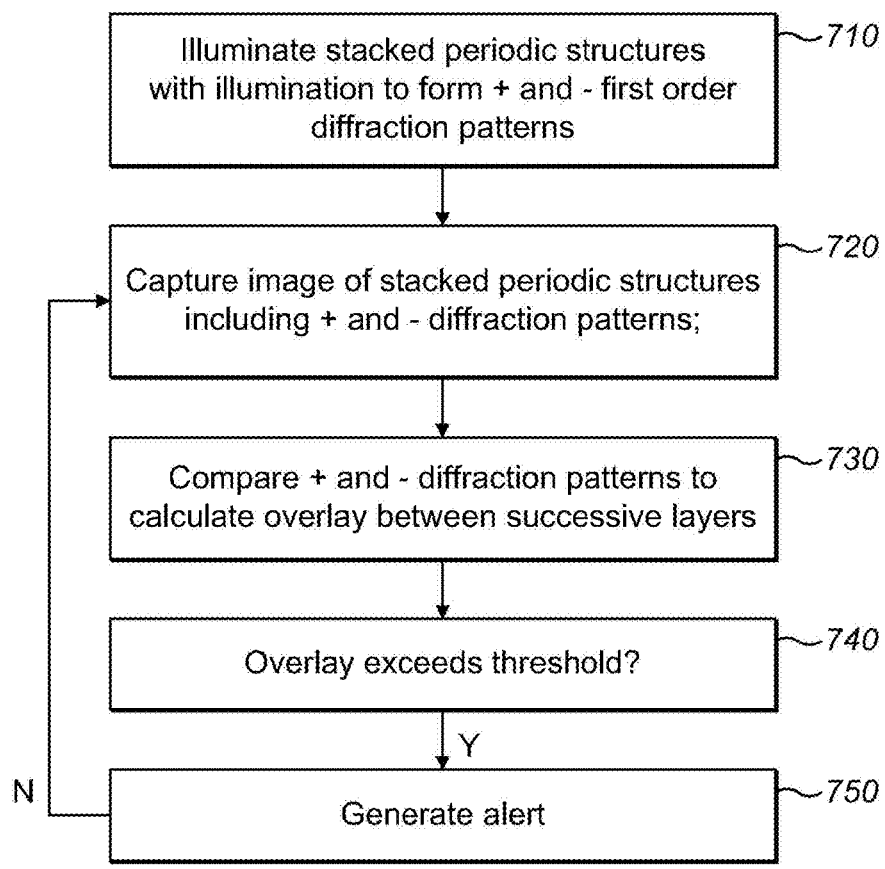
FIG. 7 is a flow diagram depicting a method according to some embodiments of the invention.

FIG. 7 is a flowchart illustrating a method according to some embodiments of the invention. The operations shown in FIG. 7 may for example be carried out in an analysis unit in a system such as analysis unit 160.

The series of operations shown in FIG. 7 begins with operation 710, illuminating stacked periodic structures with illumination to form + and − first order diffraction patterns from the periodic structures. The illumination may for example be generated by a pupil camera such as camera 130 shown in FIG. 7. Operation 710 may be followed by operation 720, capturing an image of the stacked periodic structures including + and − diffraction patterns. In some embodiments of the invention, operations 710 and 720 are not included. For example, in a method performed in an analysis unit, and operations 710 and 720 may be replaced by receiving the images of the stacked periodic structures, for example from an image capturing device.

At operation 730, the + and − diffraction patterns in the image are compared to calculate the overlay between successive layers. The comparison may involve analysis of an image, for example using any of the methods described herein The amount of the overlay may be compared, according to some embodiments of the invention, with a predetermined threshold. For example, the threshold may be set at a level of tolerance for a particular manufacturing process. An alert may be generated if the overlay exceeds the threshold. Thus in operation 740 of FIG. 7 the overlay is compared to the threshold and if the threshold is exceeded an alert may be generated at operation 750. The alert may comprise any one or more of a visual indication on a viewing screen, an audible warning and any other form of alert known to those skilled in the art. According to some embodiments of the invention, calculation of an overlay above a certain threshold may trigger an automatic shut down or cessation of a manufacturing operation. According to some embodiments of the invention, a higher threshold may be used to trigger a cessation than one that leads to an alert.

In some embodiments, a system may be enabled to operate according to the invention through different software, implemented for example in a processor in controller 180, using a currently available metrology system. Thus, some embodiments of the invention provide a computer readable medium, transitory or non-transitory, comprising instructions which when implemented in a processor of a semiconductor metrology system cause the system to operate according to any of the methods described herein.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of monitoring overlay in a manufacturing process in which successive layers are deposited one over another to form a stack and in which each layer includes a periodic structure to be aligned with a periodic structure in another layer, the method comprising:
    illuminating stacked periodic structures with illumination to form positive and negative first order diffraction patterns from the periodic structures;
    capturing an image of the stacked periodic structures including positive and negative diffraction patterns; and
    comparing the positive and negative diffraction patterns to calculate the overlay between successive layers, wherein diffraction patterns comprise interference fringes and said comparing comprises comparing the interference fringe positions to identify asymmetry between the positive and negative diffraction patterns, and wherein the interference fringe positions are determined by analyzing image intensity as a function of position in the image.

2. The method of claim 1, wherein said comparing comprises determining a characteristic frequency for each of the positive and negative diffraction patterns, and comparing the characteristic frequencies to identify an overlay between successive layers.

3. The method of claim 2 wherein the characteristic frequency is determined using a fast Fourier transform.

4. The method of claim 1 comprising determining an asymmetry factor for asymmetry in the positive and negative diffraction patterns not caused by overlay, and applying the asymmetry factor to the overlay calculation.

5. The method of claim 1 wherein said diffraction gratings are part of a multiple cell metrology target and said capturing comprises a single capture of a single cell in the metrology target.

6. The method of claim 1 in which the positive and negative diffraction patterns are first order diffraction patterns.

7. The method of claim 1 comprising comparing the calculated overlay with a predetermined threshold and generating an alert if the overlay exceeds the threshold.

8. Apparatus for monitoring overlay errors between stacked periodic structures comprising an illumination source, an image capturing device, and an analysis unit including at least one processor, wherein the processor is configured to analyse an image of stacked periodic structures including positive and negative diffraction patterns, compare the positive and negative diffraction patterns to calculate the overlay between successive layers, and identify asymmetry between the positive and negative first order diffraction patterns, wherein the diffraction patterns comprise interference fringes and the processor is configured to determine interference fringe positions by analyzing image intensity as a function of position in the image.

9. The apparatus of claim 8, wherein said comparing comprises determining a characteristic frequency for each of the positive and negative diffraction patterns, and comparing the characteristic frequencies to identify an overlay between successive layers.

10. The apparatus of claim 9 wherein the processor is configured to determine the characteristic frequency using a fast Fourier transform.

11. The apparatus of claim 8 wherein the processor is configured to determine an asymmetry factor for asymmetry in the positive and negative diffraction patterns not caused by overlay, and apply the asymmetry factor to the overlay calculation.

12. The apparatus of claim 8 wherein said diffraction gratings are part of a multiple cell metrology target and said processor is configured to perform said analyzing and comparing based on a single capture of a single cell in the metrology target.

13. A non-transitory computer readable medium comprising instructions which, when implemented in a processor in a computing system cause the system to:

receive an image of a stacked periodic structure including positive and negative diffraction patterns comprising interference fringes;

determine interference fringe positions by analyzing image intensity as a function of position in the image;

compare the interference fringe positions in the positive and negative diffraction patterns;

identify asymmetry between the positive and negative diffraction patterns;

calculate an overlay between successive layers from the degree of asymmetry between the positive and negative diffraction patterns.

14. The non-transitory computer readable medium of claim 13 wherein said instructions cause the system to determine an asymmetry factor for asymmetry in the positive and negative diffraction patterns not caused by overlay, and apply the asymmetry factor to the overlay calculation.

15. The non-transitory computer readable medium of claim 13 wherein said instructions cause the system to determine a characteristic frequency for the respective positive and negative diffraction patterns.

16. The non-transitory computer readable medium of claim 15 wherein the overlay is determined to be proportional to the ratio of the characteristic frequencies.

\* \* \* \* \*